(12) United States Patent
Lee

(10) Patent No.: US 11,950,406 B2
(45) Date of Patent: Apr. 2, 2024

(54) MEMORY DEVICE

(71) Applicant: SK hynix Inc., Gyeonggi-do (KR)

(72) Inventor: Ki Hong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 455 days.

(21) Appl. No.: 16/939,802

(22) Filed: Jul. 27, 2020

(65) Prior Publication Data

US 2021/0242210 A1    Aug. 5, 2021

(30) Foreign Application Priority Data

Jan. 31, 2020 (KR) .................. 10-2020-0012086

(51) Int. Cl.
*H10B 12/00* (2023.01)
*G11C 11/408* (2006.01)
*G11C 11/4094* (2006.01)

(52) U.S. Cl.
CPC .......... *H10B 12/31* (2023.02); *G11C 11/4085* (2013.01); *G11C 11/4094* (2013.01)

(58) Field of Classification Search
CPC ........... H01L 27/10808; G11C 11/4085; G11C 11/4094
See application file for complete search history.

(56) References Cited

U.S. PATENT DOCUMENTS

| | | | | |
|---|---|---|---|---|
| 6,040,210 A | * | 3/2000 | Burns, Jr. ............. | H10B 41/27 438/242 |
| 10,636,479 B2 | * | 4/2020 | Ikeda .................. | G11C 11/4096 |

| | | | |
|---|---|---|---|
| 2010/0320528 A1 | 12/2010 | Jeong et al. | |
| 2011/0223731 A1 | 9/2011 | Chung et al. | |
| 2011/0284939 A1 | 11/2011 | Chung et al. | |
| 2013/0099305 A1 | 4/2013 | Kim et al. | |
| 2016/0284640 A1 | 9/2016 | Wang et al. | |
| 2018/0342613 A1 | 11/2018 | Chang et al. | |
| 2019/0295626 A1 | 9/2019 | Ikeda et al. | |

FOREIGN PATENT DOCUMENTS

| | | |
|---|---|---|
| CN | 106067482 A | 11/2016 |
| KR | 20090048013 A | 5/2009 |

OTHER PUBLICATIONS

Office Action on the Chinese Patent Application No. 202010848045.X issued by the Chinese Patent Office dated Feb. 1, 2024.

\* cited by examiner

*Primary Examiner* — Jay C Kim
*Assistant Examiner* — Woo K Lee
(74) *Attorney, Agent, or Firm* — IP & T GROUP LLP

(57) ABSTRACT

A memory cell includes a bit line and a plate line that are spaced apart from each other and vertically oriented in a first direction; a transistor provided with an active region that is laterally oriented in a second direction crossing the bit line and includes a first active cylinder, a second active cylinder, and at least one channel portion oriented laterally between the first active cylinder and the second active cylinder; a word line extending in a third direction while surrounding the at least one channel portion of the active region; and a capacitor oriented laterally in the second direction between the active region and the plate line.

19 Claims, 25 Drawing Sheets

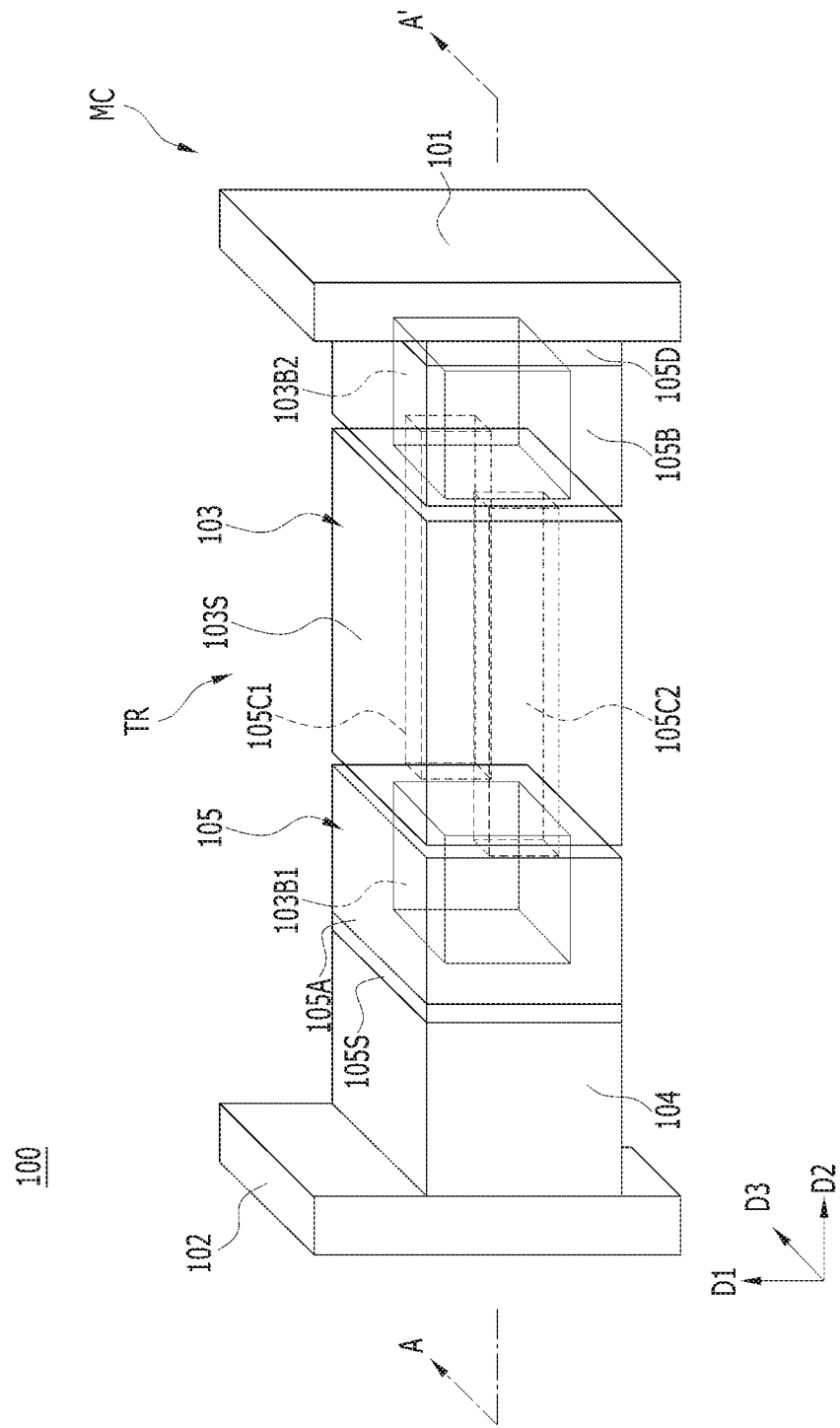

MEMORY DEVICE

CROSS-REFERENCE TO RELATED APPLICATIONS

The present application claims priority to Korean Patent Application No. 10-2020-0012086, filed on Jan. 31, 2020, which is incorporated herein by reference in its entirety.

BACKGROUND

1. Field

Various embodiments of the present invention relate generally to a semiconductor device and, more particularly, to a three-dimensional semiconductor device having improved integration density.

2. Description of the Related Art

Since the integration density of a two-dimensional (2D) or planar semiconductor device is mainly determined by the area occupied by a unit memory cell, the integration density is greatly affected by the level of fine pattern formation technology. The miniaturization of pattern requires highly expensive equipment. For this reason, although the integration density of 2D semiconductor devices is increasing, the extent of the increase the integration density is limited. To overcome these limitations of 2D semiconductor devices, three-dimensional (3D) memory devices having memory cells that are arranged in three dimensions have been suggested.

SUMMARY

Embodiments of the present invention are directed to a 3D memory device having improved integration density.

In accordance with an embodiment of the present invention, a memory cell includes a bit line and a plate line that are spaced apart from each other and vertically oriented in a first direction; a transistor provided with an active region that is laterally oriented in a second direction crossing the bit line and includes a first active cylinder, a second active cylinder, and at least one channel portion oriented laterally between the first active cylinder and the second active cylinder; a word line extending in a third direction while surrounding the at least one channel portion of the active region; and a capacitor oriented laterally in the second direction between the active region and the plate line.

In accordance with another embodiment of the present invention, a memory device includes a memory cell array including a plurality of memory cells that are vertically arranged in one direction, wherein each of the memory cells includes a bit line and a plate line that are spaced apart from each other and vertically oriented in a first direction; a transistor provided with an active region that is laterally oriented in a second direction crossing the bit line and includes a first active cylinder, a second active cylinder, and at least one channel portion oriented laterally between the first active cylinder and the second active cylinder; a word line extending in a third direction while surrounding the at least one channel portion of the active region; and a capacitor oriented laterally in the second direction between the active region and the plate line.

In accordance with yet another embodiment of the present invention, a memory cell includes a substrate; an active layer include a first recessed portion, a second recessed portion and at least one nano wire channel oriented laterally between the first recessed portion and the second recessed portion, the active layer is spaced apart from the substrate; a word line surrounding the at least one nano wire channel; a bit line coupled to one side of the active layer and oriented vertically from the substrate; a capacitor coupled to another side of the active layer and oriented laterally from the active layer. The word line may include buried portions buried in the first and second recessed portions.

In accordance with yet another embodiment of the present invention, a semiconductor device includes an active region including a first active cylinder, a second active cylinder, and at least one channel portion oriented laterally between the first active cylinder and the second active cylinder; a surrounding gate electrode surrounding the at least one channel portion; a first buried gate electrode extending from one side of the surrounding gate electrode and buried in the first active cylinder; and a second buried gate electrode extending from another side of the surrounding gate electrode and buried in the second active cylinder.

BRIEF DESCRIPTION OF THE DRAWINGS

FIG. 6B is a perspective diagram illustrating the individual memory cell MC shown in FIG. 6A in detail.

DETAILED DESCRIPTION

Figure 1:
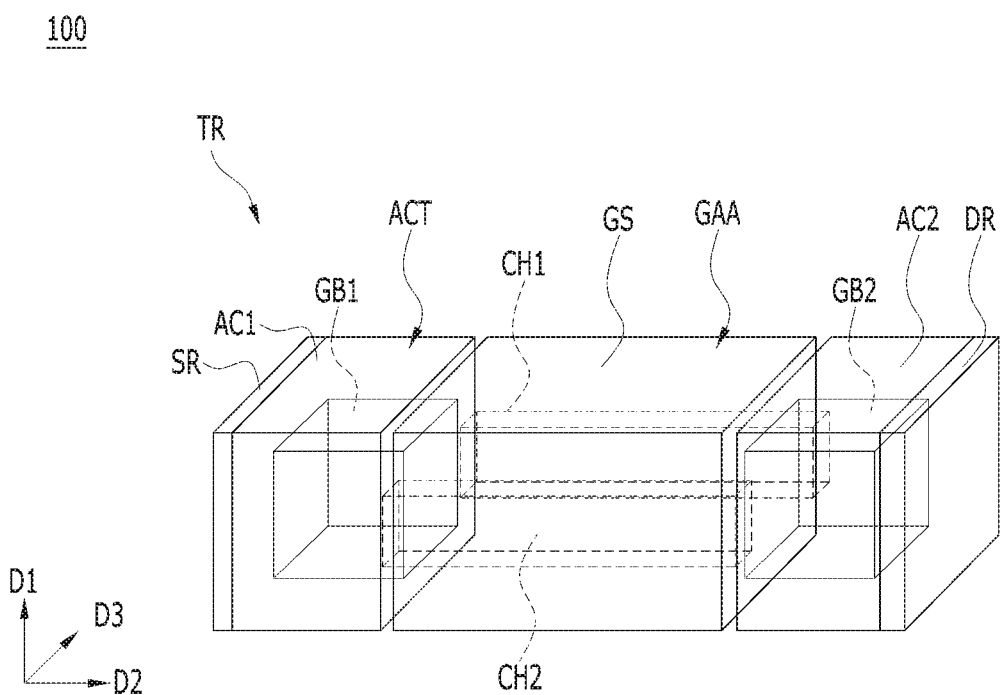
FIG. 1 is a perspective diagram illustrating a transistor TR in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a perspective diagram illustrating a semiconductor device 100 in accordance with an embodiment of the present invention.

Referring to FIG. 1, the semiconductor device 100 may include a gate all-around semiconductor device. The semiconductor device 100 may include a transistor TR. The transistor TR may include a lateral transistor. The transistor TR may include a gate all-around transistor.

The transistor TR may include a first doped region SR, a second doped region DR, an active region ACT between the first doped region SR and the second doped region DR, and a gate electrode GAA that surrounds a portion of the active region ACT.

The first doped region SR and the second doped region DR may be extended along a first direction D1. The first doped region SR and the second doped region DR may be arranged at opposite end regions of the transistor TR along the second direction D2. Each of the first doped region SR and the second doped region DR may have a vertical flat plate shape extending in a first and third directions D1 and D3. The first doped region SR and the second doped region DR may be disposed spaced apart from each other in the second direction D2. The first doped region SR and the second doped region DR may be electrically connected through the active region ACT. The first doped region SR and the second doped region DR may be doped portions of the active region ACT. The first doped region SR and the second doped region DR may include a silicon-containing material. The first doped region SR and the second doped region DR may include a monocrystalline silicon layer, a polysilicon layer, a doped silicon layer, a doped polysilicon layer, or a combination thereof. The first doped region SR and the second doped region DR may include N-type impurities or P-type impurities. The first doped region SR and the second doped region DR may include phosphorus (P), arsenic (As), boron (B), indium (In), or a combination thereof. The first doped region SR and the second doped region DR may be doped with the same impurity. The first doped region SR and the second doped region DR may be referred to as first and second source/drain regions. The first doped region SR may be formed over a first edge of the active region ACT, and the second doped region DR may be formed over a second edge of the active region ACT. According to another embodiment of the present invention, the first doped region SR may provide the first edge of the active region ACT, and the second doped region DR may provide the second edge of the active region ACT. In other words, the first doped region SR and the second doped region DR may be formed in the first edge and the second edge of the active region ACT, respectively. Each of the first doped region SR and the second doped region DR may have a vertical structure extending in the first direction D1.

The active region ACT may be positioned between the first doped region SR and the second doped region DR. The active region ACT may extend in the second direction D2 between the first and second doped regions SR and DR. The second direction D2 may be perpendicular to the first direction D1. The active region ACT may be referred to as a lateral active region or a lateral active layer. The active region ACT may include first and second active cylinder AC1, AC2, and at least one channel portion CH1 and CH2 that are oriented laterally between the first active cylinder AC1 and the second active cylinder AC2. The first active cylinder AC1 may be coupled to the first doped region SR, and the second active cylinder AC2 may be coupled to the second doped region DR. The first and second active regions AC1 and AC2 may have a cylinder-shape inside, respectively. The cylinder-shape inside shape may also be referred to as a cylindrical inside or recessed inside.

The gate electrode GAA may include a surrounding portion GS that surrounds the at least one channel portion CH1 and CH2 of the active region ACT. The surrounding portion GS may extend between the first and second active regions AC1 and AC2. The gate electrode GAA may further include a first buried portion GB1 extending from a first side of the surrounding portion GS and buried into the cylindrical inside of the first active cylinder AC1. The gate electrode GAA may further include a second buried portion GB2 extending from a second side of the surrounding portion GS and buried into the cylindrical inside of the second active cylinder AC2. The first and second sides of the surrounding portion GS may be opposite to each other in the second direction D2. The surrounding portion GS may extend in a third direction D3. The third direction D3 may be perpendicular to the first direction D1 and the second direction D2. The first, second and third directions D1, D2 and D3 may be orthogonal to each other. The surrounding portion GS may be referred to as a surrounding gate electrode, and the first and second buried portions GB1 and GB2 may be referred to as a first and second buried gate electrodes, respectively.

Figure 2A:
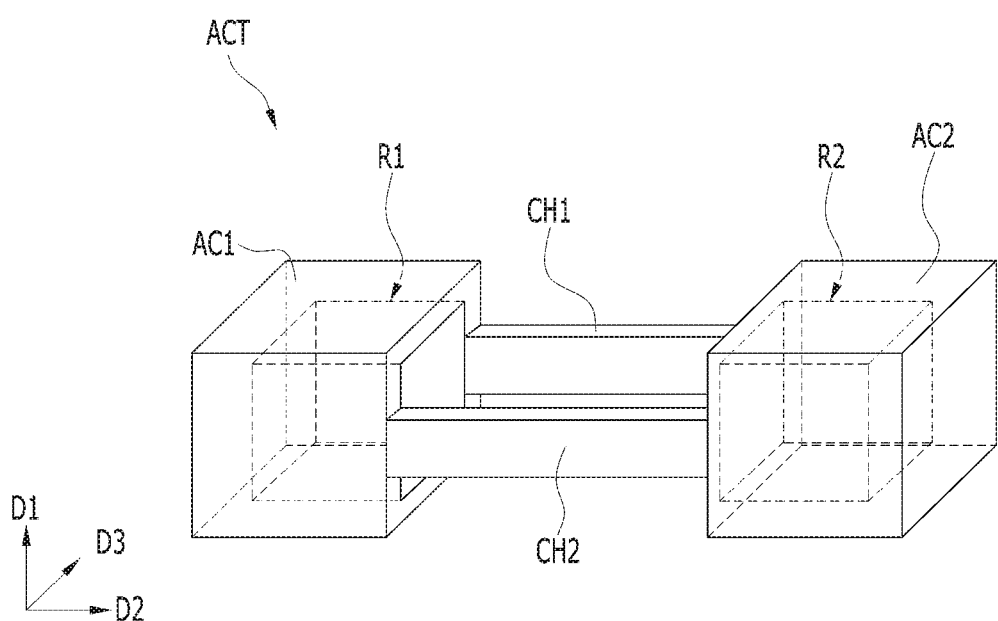
FIG. 2A is a detailed view of an active region.
Figure 2B:
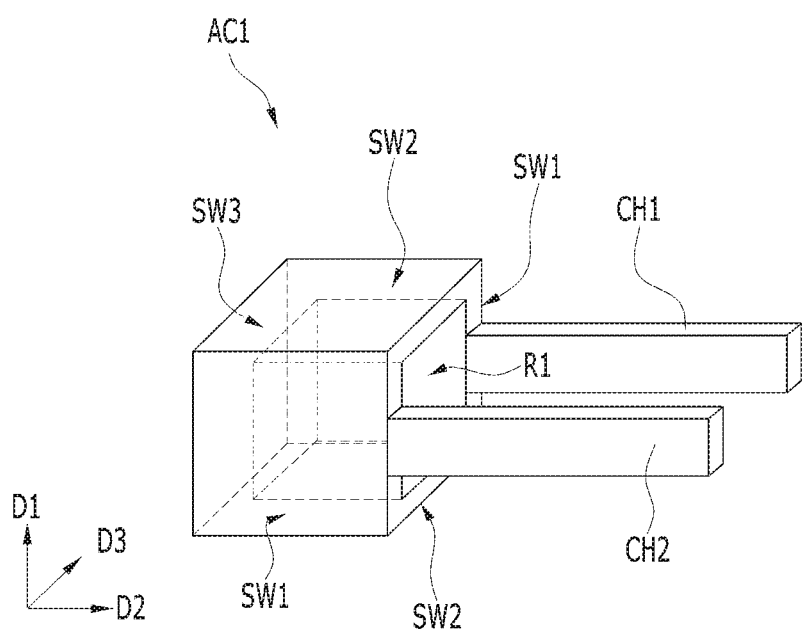
FIG. 2B is a detailed view of a source region.
Figure 2C:
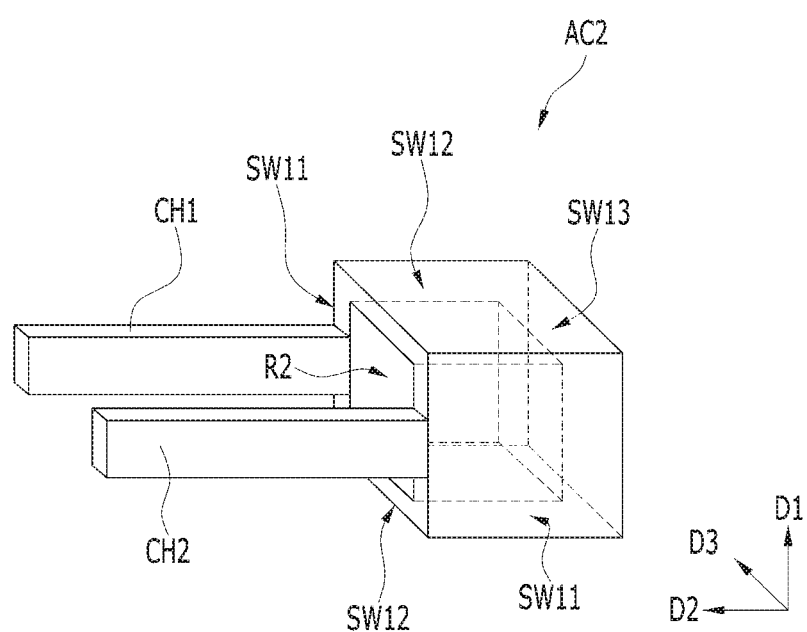
FIG. 2C is a detailed view of a drain region.
Figure 2D:
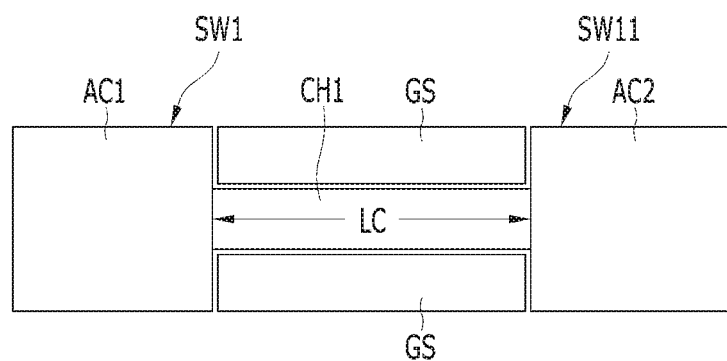
FIG. 2D is a cross-sectional view illustrating a first channel portion, a source region, and a drain region.
Figure 2E:
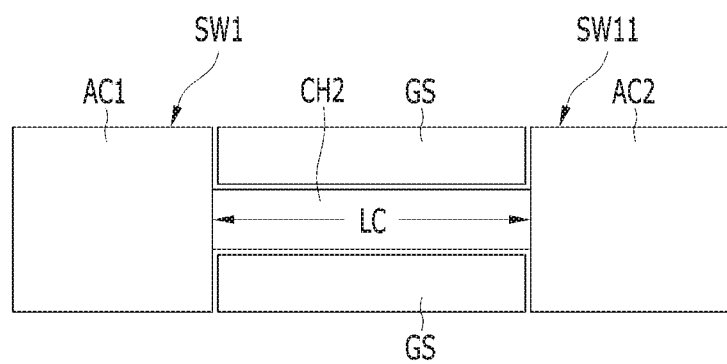
FIG. 2E is a cross-sectional view illustrating a second channel portion, a source region, and a drain region.

FIG. 2A is a detailed view of the active region ACT. FIG. 2B is a detailed view of the first active cylinder AC1. FIG. 2C is a detailed view of the second active cylinder AC2. FIG. 2D is a cross-sectional view illustrating the first channel portion CH1, the first active cylinder AC1, and the second active cylinder AC2. FIG. 2E is a cross-sectional view illustrating the second channel portion CH2, the first active cylinder AC1, and the second active cylinder AC2.

Referring to FIGS. 2A to 2E, the active region ACT may include the first active cylinder (AC1), the second active cylinder (AC2), and at least one channel portion CH1 and CH2 between the first active cylinder AC1 and the second active cylinder AC2. The first active cylinder AC1 and the second active cylinder AC2 may be spaced apart from each other in the second direction D2. The at least one channel portion CH1 and CH2 may be formed in the shape of elongated beams extending laterally in the second direction D2 between the first active cylinder AC1 and the second active cylinder AC2. The at least one channel portion CH1 and CH2 may include a first channel portion CH1 and a second channel portion CH2. The first channel portion CH1 and the second channel portion CH2 may be spaced apart from each other in the third direction D3. The first channel portion CH1 and the second channel portion CH2 may be parallel to each other. The first channel portion CH1 and the second channel portion CH2 may be referred to as nano wire channel.

The active region ACT may further include a first recessed portion R1 and a second recessed portion R2. The first recessed portion R1 may be formed in the first active cylinder AC1, and the second recessed portion R2 may be formed in the second active cylinder AC2. The first recessed portion R1 and the second recessed portion R2 may be lateral recesses and may have a shape recessed in the second direction D2. The first recessed portion R1 may not penetrate the first active cylinder AC1 in the second direction D2, and the second recessed portion R2 may not penetrate the second active cylinder AC2 in the second direction D2. The first active cylinder AC1 may be referred to as a first active layer with a first recessed portion R1. The second active cylinder AC2 may be referred to as a second active layer with a second recessed portion R2. The first channel portion CH1 and the second channel portion CH2 may be oriented laterally between the first recessed portion R1 and the second recessed portion R2, respectively. The active region ACT may include the first recessed portion R1, the second recessed portion R2 and at least on channel portion CH1, CH2 oriented laterally between the first recessed portion R1 and the second recessed portion R2.

The first active cylinder AC1 may include a pair of first side walls SW1, a pair of second side walls SW2, and a third side wall SW3. The pair of first side walls SW1 may extend in the first direction D1 and may be opposite to each other in the third direction D3. The pair of second side walls SW2 may extend in the second direction D2 and may be opposite to each other in the first direction D1. The first side walls SW1 and the second side walls SW2 may be coupled to each other. The third side wall SW3 may extend in the third direction D3 and couple opposite side edges of the first side walls SW1 and of the second side walls SW2 to each other. The first recessed portion R1 may be defined inside the first active cylinder AC1 by a combination of the pair of first side walls SW1, the pair of second side walls SW2, and the third side wall SW3, and the first recessed portion R1 may extend in the second direction D2. The first recessed portion R1 may not penetrate the first active cylinder AC1 in the second direction D2 due to the third side wall SW3. The third side wall SW3 may be coupled to the first doped region SR and may provide a first edge of the active region ACT. The third side wall SW3 may be the first doped region SR. The active region ACT may include the first doped region SR, and accordingly, the first edge of the active region ACT may be provided by the first doped region SR. The pair of first side walls SW1 and the pair of second side walls SW2 may be referred to as the lateral side walls of the first active cylinder AC1, and the third side wall SW3 may be referred to as the vertical side wall thereof. Referring to FIGS. 2B, 2D and 2E, the first channel portion CH1 may be coupled to a side edge of one first side wall SW1 of the first side walls SW1, and the second channel portion CH2 may be coupled to a side edge of another first side wall SW1 of the first side walls SW1. The height of each of the first side walls SW1 may be higher than each of the heights of the first channel portion CH1 and the second channel portion CH2. The first channel portion CH1 and the second channel portion CH2 may be positioned at a level between the second side walls SW2. For example, the first channel portion CH1 and the second channel portion CH2 may be positioned at a lower level than an upper second side wall SW2, and the first channel portion CH1 and the second channel portion CH2 may be positioned at a higher level than a lower second side wall SW2.

Referring to FIG. 2C, the second active cylinder AC2 may include a pair of first side walls SW11, a pair of second side walls SW12, and a third side wall SW13. The pair of first side walls SW11 may extend in the first direction D1 and may be opposite to each other. The pair of second side walls SW12 may extend in the second direction D2 and may be opposite to each other. The first side walls SW11 and the second side walls SW12 may be coupled to each other. The third side wall SW13 may extend in the third direction D3, and couple opposite side edges of the first side walls SW11 and opposite side edges of the second side walls SW12 to each other. The second recessed portion R2 may be defined inside the second active cylinder AC2 by a combination of the pair of first side walls SW11, the pair of second side walls SW12, and the third side wall SW13, and the second recessed portion R2 may extend in the second direction D2. The second recessed portion R2 may not penetrate the second active cylinder AC2 due to the third side wall SW13. The third side wall SW13 may be coupled to the second doped region DR, and may provide a second edge of the active region ACT. The third side wall SW13 may be the second doped region DR. The active region ACT may include a second doped region DR, and accordingly, the second edge of the active region ACT may be provided by the second doped region DR. The pair of first side walls SW11 and the pair of second side walls SW12 may be referred to as the lateral side walls of the first active region AC1, and the third side wall SW13 may be vertical side walls. Referring to FIGS. 2C, 2D and 2E, the first channel portion CH1 may be coupled to a side edge of one first side wall SW11 of the first side walls SW11, and the second channel portion CH2 may be coupled to a side edge of the other first side wall SW11 of the first side walls SW11. The height of the first side walls SW11 may be higher than the height of the first channel portion CH1 and the second channel portion CH2. The first channel portion CH1 and the second channel portion CH2 may be positioned at a level between the second side walls SW12. For example, the first channel portion CH1 and the second channel portion CH2 may be positioned at a lower level than an upper second side wall SW12, and the first channel portion CH1 and the second channel portion CH2 may be positioned at a higher level than a lower second side wall SW12. The first channel portion CH1 and the second channel portion CH2 may have the same shape and dimensions.

As described above, the active region ACT may include the first channel portion CH1 and the second channel portion CH2. The first active cylinder AC1 may be coupled to first side edges of the first and second channel portions CH1 and CH2, and the second active cylinder AC2 may be coupled to second side edges of the first and second channel portions CH1 and CH2. The first active cylinder AC1 and the second active cylinder AC2 may be opposite to each other in the second direction D2. The first active cylinder AC1 and the second active cylinder AC2 may be symmetrical to each other in the second direction D2. The first recessed portion R1 and the second recessed portion R2 may be symmetrical to each other. The shapes, sizes, depths, widths, and heights of the first recessed portion R1 and the second recessed portion R2 may be the same. The first active cylinder AC1 and the second active cylinder AC2 may have a lateral cylindrical shape.

Figure 3A:
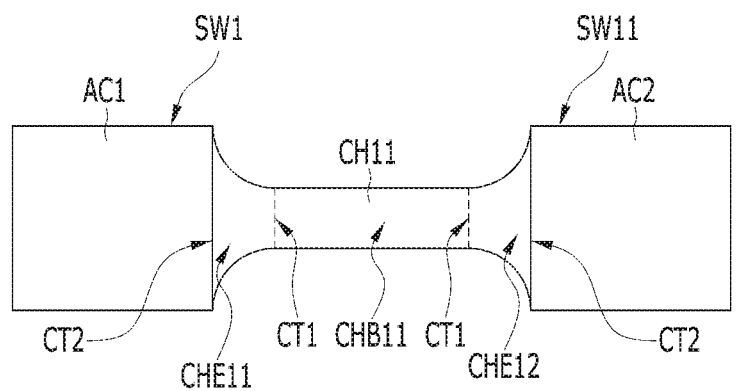
FIGS. 3A and 3B are cross-sectional views illustrating an active region in accordance with another embodiment of the present invention.
Figure 3B:
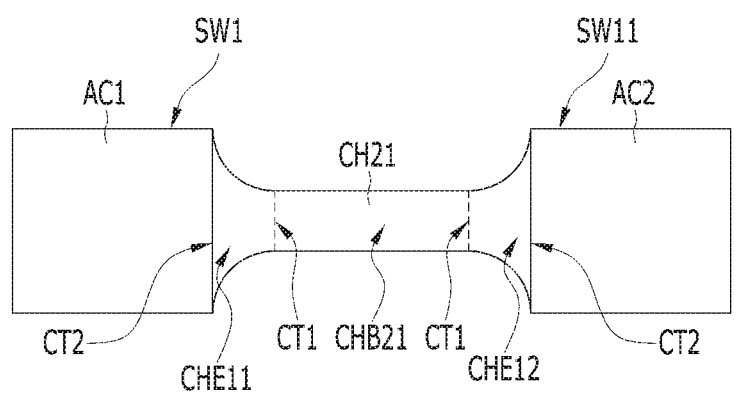

FIGS. 3A and 3B are cross-sectional views illustrating an active region in accordance with another embodiment of the present invention. In FIGS. 1 to 3B, like reference numerals denote like elements, and detailed descriptions thereof are omitted. FIG. 3A is a cross-sectional view illustrating a first channel portion CH11, the first active cylinder AC1 and the second active cylinder AC2, and FIG. 3B is a cross-sectional view illustrating a second channel portion CH21, the first active cylinder AC1 and the second active cylinder AC2.

Referring to FIG. 3A, the first active cylinder AC1 may be coupled to a first-side edge (which is, hereinafter, referred to as a first edge) of the first channel portion CH11, and the second active cylinder AC2 may be coupled to a second side edge (which is, hereinafter, referred to as a second edge) of the first channel portion CH11. The first channel portion CH11 may include a channel body CHB11, a first edge CHE11 and a second edge CHE12. The first edge CHE11 of the first channel portion CH11 may be coupled to the first side wall SW1 of the first active cylinder AC1, and the second edge CHE12 of the first channel portion CH11 may be coupled to the second side wall SW11 of the second active cylinder AC2. A contact surface CT1 between the channel body CHB11 and the first edge CHE11 may be smaller than a contact surface CT2 between the first side wall SW1 of the first active cylinder AC1 and the first edge CHE11. The contact surface CT1 between the channel body CHB11 and the second edge CHE12 may be smaller than the contact surface CT2 between the first side wall SW11 of the second active cylinder AC2 and the second edge CHE12. The first edge CHE11 and the second edge CHE12 of the first channel portion CH11 may have a rounded profile individually and may be of the same cross-sectional area. The first edge CHE11 may have a shape that gradually decreases in width from the first side wall SW1 of the first active cylinder AC1 toward the channel body CHB11. The second edge CHE12 may have a shape that gradually decreases in width from the first side wall SW11 of the second active cylinder AC2 toward the channel body CHB11.

Referring to FIG. 3B, the first active cylinder AC1 may be coupled to a first side edge (which is, hereinafter, referred to as a first edge) of the second channel portion CH21, and the second active cylinder AC2 may be coupled to a second side edge (which is, hereinafter, referred to as a second edge) of the second channel portion CH21. The second channel portion CH21 may include a channel body CHB21, a first edge CHE21, and a second edge CHE22. The first edge CHE21 of the second channel portion CH21 may be coupled to the first side wall SW1 of the first active cylinder AC1, and the second edge CHE22 of the second channel portion CH21 may be coupled to the first side wall SW11 of the second active cylinder AC2. The contact surface CT1 between the channel body CHB21 and the first edge CHE21 may be smaller than the contact surface CT2 between the first side wall SW1 of the first active cylinder AC1 and the first edge CHE21. The contact surface CT1 between the channel body CHB21 and the second edge CHE22 may be smaller than the contact surface CT2 between the first side wall SW11 of the second active cylinder AC2 and the second edge CHE22. The first edge CHE21 and the second edge CH22 of the second channel portion CH21 may have a rounded profile individually. The first edge CHE21 may have a shape that gradually decreases in width from the first side wall SW1 of the first active cylinder AC1 toward the channel body CHB21. The second edge CHE22 may have a shape that gradually decreases in width from the first side wall SW11 of the second active cylinder AC2 toward the channel body CHB21.

Figure 4A:
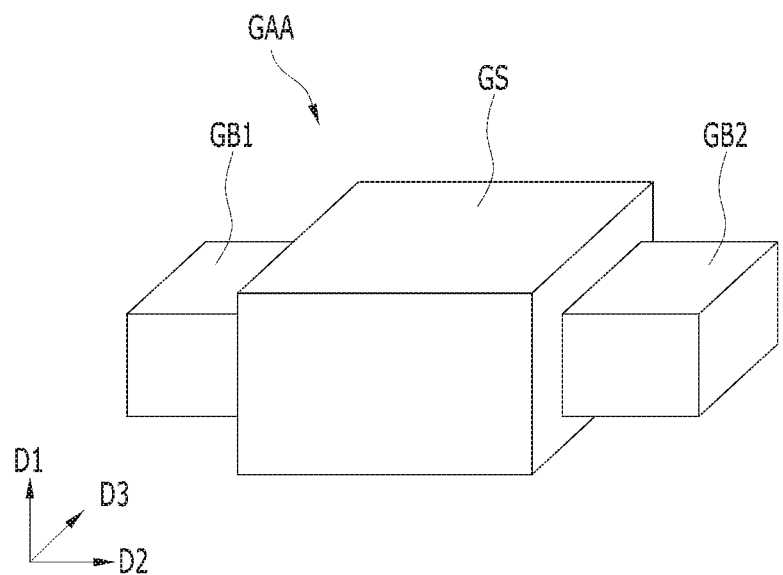
FIG. 4A is a perspective diagram illustrating a gate electrode GAA shown in FIG. 1.
Figure 4B:
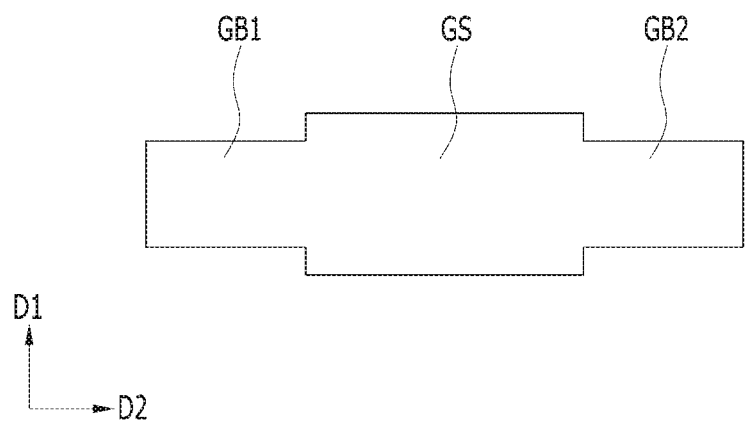
FIG. 4B is a cross-sectional view taken along a second direction D2 shown in FIG. 4A.

FIG. 4A is a perspective diagram illustrating the gate electrode GAA shown in FIG. 1. FIG. 4B is a cross-sectional view taken along the second direction D2 shown in FIG. 4A.

Referring to FIGS. 4A and 4B, the gate electrode GAA may include a surrounding portion GS, a first buried portion GB1, and a second buried portion GB2. The surrounding portion GS may extend in the third direction D3. The surrounding portion GS may be positioned between the first and second buried portions GB1 and GB2 in the second direction D2. The first buried portion GB1 and the second buried portion GB2 may extend from the vertical sides of the surrounding portion GS in the second direction D2. The first buried portion GB1 and the second buried portion GB2 may be coupled to both sides of the surrounding portion GS. The first buried portion GB1 may extend laterally from the surrounding portion GS in the second direction D2. The second buried portion GB2 may extend laterally from the surrounding portion GS in the second direction D2. The height of the surrounding portion GS (dimension in the first direction D1) may be higher than the height of each of the first and second buried portions GB1 and GB2.

Figure 4C:
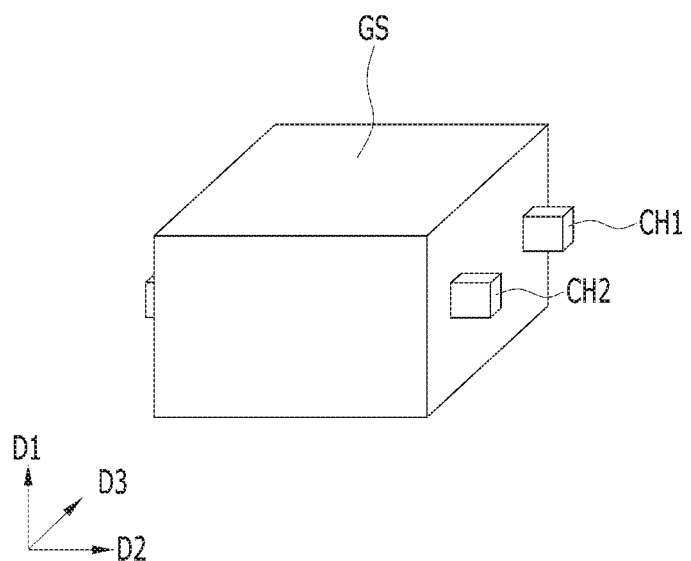
FIG. 4C is a perspective view illustrating a surrounding portion, a first channel portion, and a second channel portion of the gate electrode GAA.
Figure 4D:
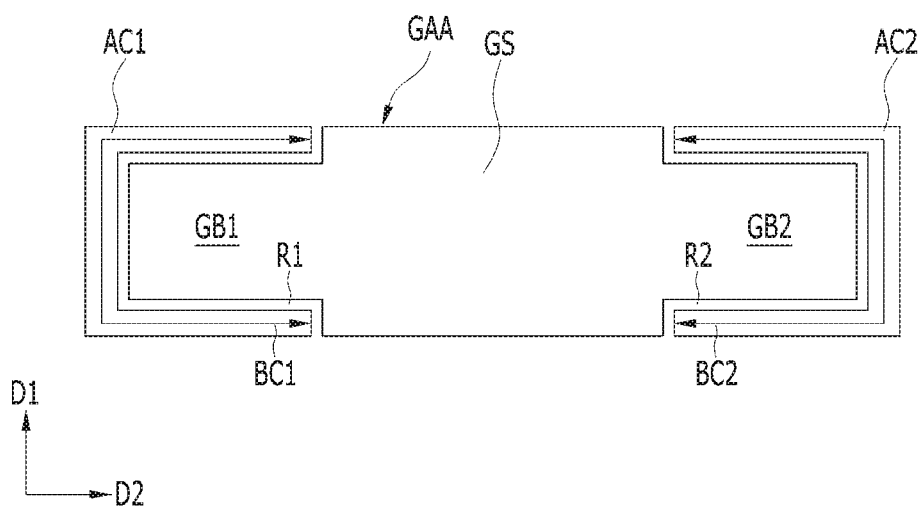
FIG. 4D is a cross-sectional view illustrating a gate electrode GAA, a first active cylinder, and a second active cylinder.

FIG. 4C is a perspective view illustrating the surrounding portion, the first channel portion, and the second channel portion of the gate electrode GAA. FIG. 4D is a cross-sectional view illustrating the gate electrode GAA, the first active cylinder, and the second active cylinder.

Referring to FIGS. 4C and 4D, the surrounding portion GS of the gate electrode GAA may have a shape that surrounds the first channel portion CH1 and the second channel portion CH2. The first buried portion GB1 and the second buried portion GB2 may not surround the first and second channel portions CH1 and CH2. The first buried portion GB1 and the second buried portion GB2 may be spaced apart from the first and second channel portions CH1 and CH2. The first buried portion GB1 may extend to be positioned in the first recessed portion R1 of the first active cylinder AC1. The first buried portion GB1 may fill the first recessed portion R1 of the first active cylinder AC1. The second buried portion GB2 may extend to be positioned in the second recessed portion R2 of the second active cylinder AC2. The second buried portion GB2 may fill the second recessed portion R2 of the second active cylinder AC2.

Referring to FIGS. 2A to 4D, a lateral channel (see reference symbol 'LC' in FIGS. 2D and 2E) may be defined in the first channel portion CH1 and the second channel portion CH2 by the surrounding portion GS of the gate electrode GAA. A first buried channel BC1 may be defined on the cylinder surface of the first active cylinder AC1 by the first buried portion GB1 of the gate electrode GAA. A second buried channel BC2 may be defined on the cylinder surface of the second active cylinder AC2 by the second buried portion GB2 of the gate electrode GAA. The first buried channel BC1 and the second buried channel BC2 will be described with reference to FIG. 4D.

As described above, the transistor TR may include a gate all-around (GAA) structure and a hybrid channel. The hybrid channel may refer to a structure in which the lateral channel LC by the surrounding portion GS, and the first and second buried channels BC1 and BC2 by the first and second buried portions GB1 and GB2 are mixed.

Although not illustrated, a gate dielectric layer may be formed between the gate electrode GAA, and the first and second channel portions CH1 and CH2. The gate dielectric layer may be formed between the first buried portion GB1 of the gate electrode GAA and the first active cylinder AC1. The gate dielectric layer may be formed between the second buried portion GB2 of the gate electrode GAA and the second active cylinder AC2. The gate dielectric layer may conformally cover the surface of the first recessed portion R1 of the first active cylinder AC1 and the surface of the second recessed portion R2 of the second active cylinder AC2. The gate dielectric layer may be formed between the surrounding portion GS of the gate electrode GAA and the first channel portion CH2. The gate dielectric layer may be formed between the surrounding portion GS of the gate electrode GAA and the second channel portion CH2. The gate dielectric layer may have a surrounding shape that conformally surrounds the first channel portion CH1 and the second channel portion CH2. The gate dielectric layer may include silicon oxide, silicon nitride, silicon oxynitride, a high-k material, or a combination thereof.

The active region ACT may include a semiconductor material such as polysilicon. The active region ACT may include doped polysilicon, undoped polysilicon, or amorphous silicon. The first active cylinder AC1 and the second active cylinder AC2 may be doped with an N-type impurity or a P-type impurity. The first active cylinder AC1 and the second active cylinder AC2 may be doped with an impurity of the same conductivity type. The first active cylinder AC1 and the second active cylinder AC2 may include at least one impurity selected from a group including arsenic (As), phosphorus (P), boron (B), indium (In), and combinations thereof. The first channel portions CH1 and CH11 may be doped with a conductive impurity. The second channel portions CH2 and CH21 may be doped with a conductive impurity. The first channel portion CH1 and the second channel portion CH2 may include silicon nano wire, respectively. The first channel portion CH11 and the second channel portion CH21 may include silicon nano wire, respectively.

The gate electrode GAA may include a metal, a metal mixture, a metal alloy, a semiconductor material, a work function material, a barrier material, or a combination thereof.

Figure 5:
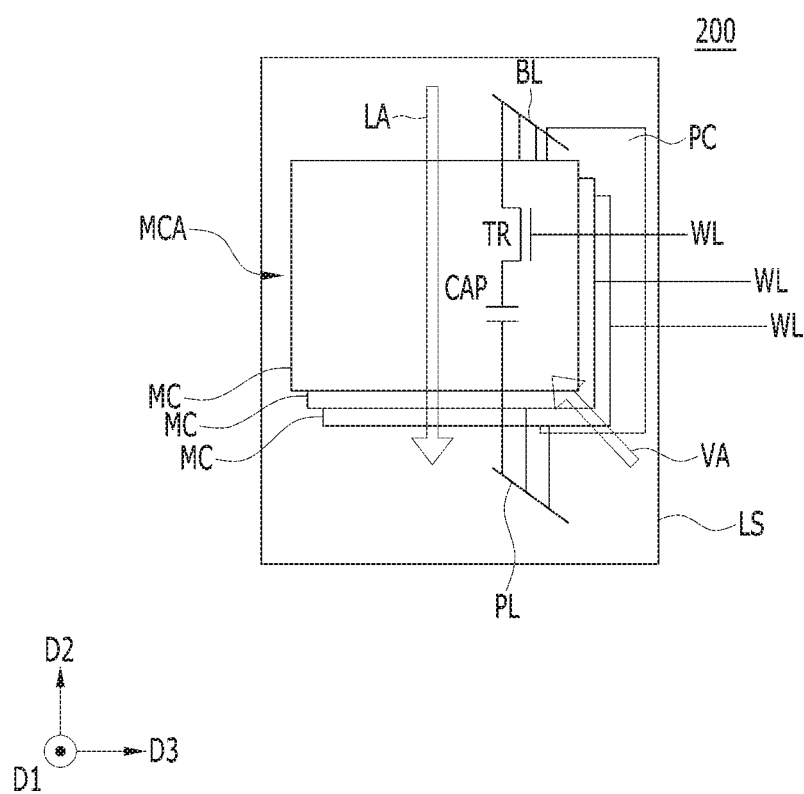
FIG. 5 schematically illustrates a memory device in accordance with an embodiment of the present invention.

FIG. 5 schematically illustrates a memory device 200 in accordance with an embodiment of the present invention.

Referring to FIG. 5, the memory device 200 may include a substrate structure LS, and a memory cell array MCA may be formed over the substrate structure LS. The memory cell array MCA may be vertically oriented VA in the first direction D1 from the substrate structure LS. The memory cell array MCA may include a plurality of memory cells MC, and each of the memory cells MC may include a bit line BL, a transistor TR, a capacitor CAP, and a plate line PL. Each of the memory cells MC may further include a word line WL. The word line WL may extend in the third direction D3. In each memory cell MC, the bit line BL, the transistor TR, the capacitor CAP, and the plate line PL may be positioned in a lateral arrangement LA in the second direction D2.

The substrate structure LS may be of a material suitable for semiconductor processing. The substrate structure LS may include at least one among a conductive material, a dielectric material, and a semiconductor material. Various materials may be formed in the substrate structure LS. The substrate structure LS may include a semiconductor substrate, and the semiconductor substrate may be formed of a silicon-containing material. For example, the substrate structure LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate structure LS may include other semiconductor materials, such as germanium. The substrate structure LS may include a group III/V semiconductor substrate, for example, a compound semiconductor substrate such as GaAs. The substrate structure LS may include a Silicon-On-Insulator (SOI) substrate.

According to another embodiment of the present invention, the substrate structure LS may include a semiconductor substrate, and a plurality of integrated circuits, multi-level metal wires MLM, or a combination thereof that are formed over the semiconductor substrate. For example, the substrate structure LS may include a peripheral circuit unit (refer to a reference symbol 'PC'), and the peripheral circuit unit PC may include a plurality of control circuits for controlling the memory cell array MCA. At least one control circuit of the peripheral circuit unit PC may include an N-channel transistor, a P-channel transistor, a CMOS circuit, or a combination thereof. At least one control circuit of the peripheral circuit unit PC may include an address decoder circuit, a read circuit, and a write circuit. At least one control circuit of the peripheral circuit unit PC may include a planar channel transistor, a recess channel transistor, a buried gate transistor, a fin channel transistor (FinFET), and the like. The peripheral circuit unit PC may include a sense amplifier SA, and the sense amplifier SA may be coupled to a multi-level metal wire (MLM).

The memory cell array MCA may include a stack of memory cells MC. The memory cells MC may be vertically stacked in the first direction D1 over the substrate structure LS.

Each of the individual memory cells MC may include a bit line BL, a transistor TR, a capacitor CAP, and a plate line PL. The transistor TR may include the transistor TR shown in FIG. 1. The gate electrode GAA of the transistor TR may be referred to as a word line WL. The transistor TR may be positioned between the bit line BL and the capacitor CAP. The transistor TR may be positioned in a lateral arrangement LA in the second direction D2 which is parallel to the surface of the substrate structure LS. In short, the transistor TR may be positioned laterally between the bit line BL and the capacitor CAP.

The bit line BL may extend from the substrate structure LS in the first direction D1. The plane of the substrate structure LS may be provided by the second direction D2 and the third direction D3. The bit line BL may be vertically oriented from the substrate structure LS. Herein, the vertical orientation may refer to the bit line BL being vertically oriented by directly contacting the substrate structure LS. For example, a bottom portion of the bit line BL may be directly coupled to the peripheral circuit unit PC. The bit line BL may have a vertically elevated pillar-shape. The bit line BL may be referred to as a vertically oriented bit line or a pillar-type bit line. The vertically stacked memory cells MC may share one bit line BL.

Figure 6A:
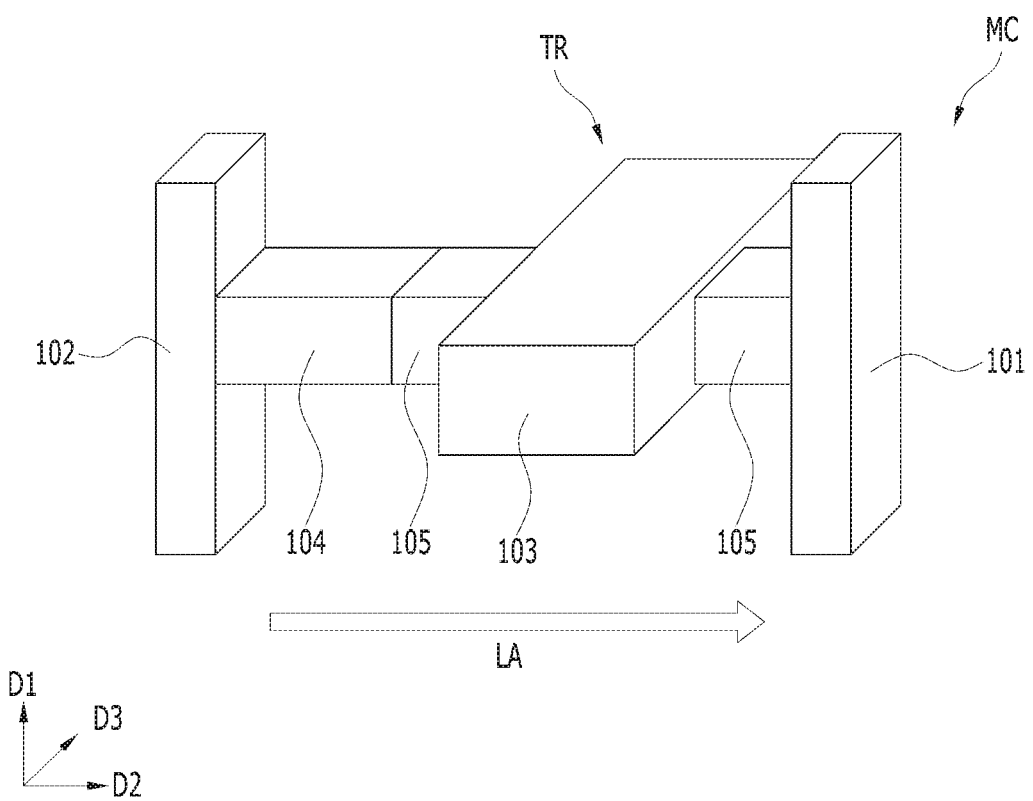
FIG. 6A is a perspective diagram schematically illustrating an individual memory cell MC shown in FIG. 5.
Figure 6C:
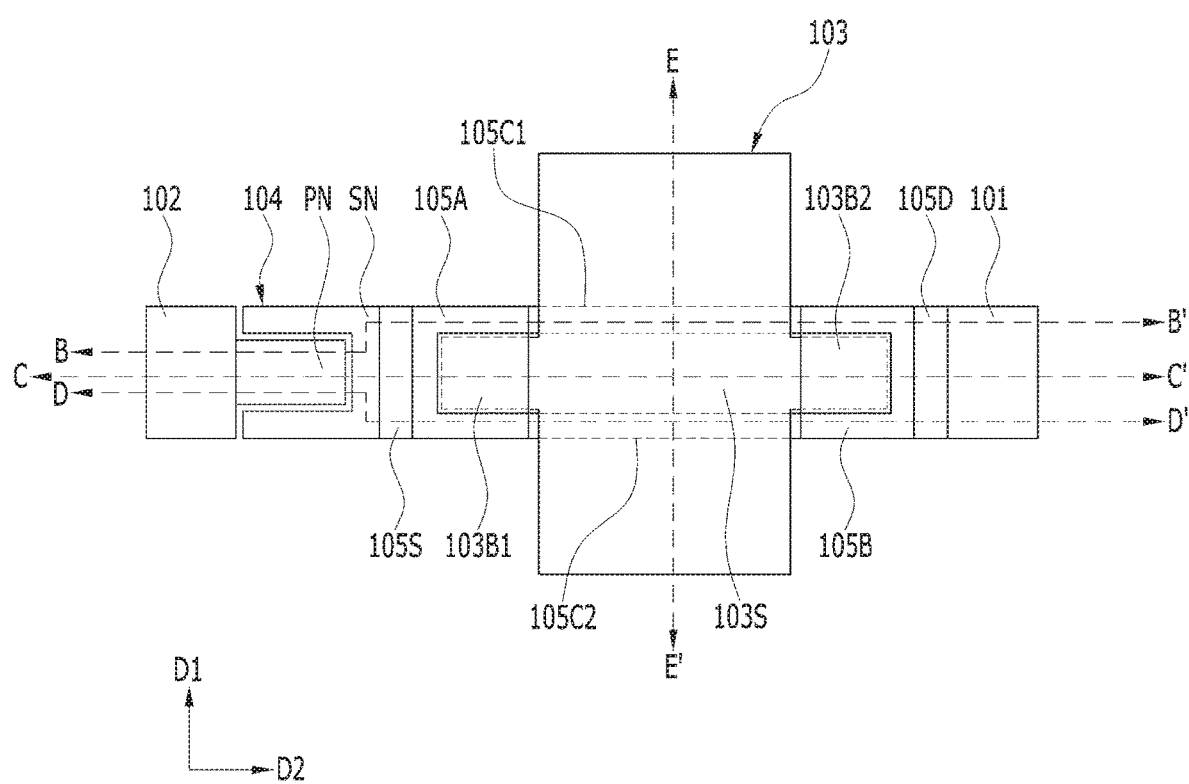
FIG. 6C is a cross-sectional view taken along a line A-A' shown in FIG. 6B.
Figure 6D:
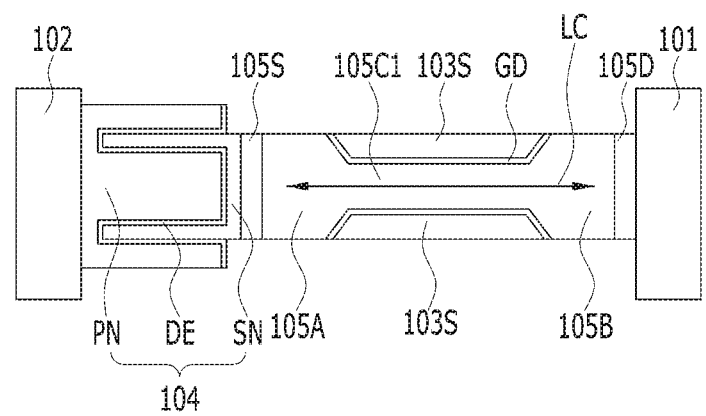
FIG. 6D is a cross-sectional view taken along a line B-B' shown in FIG. 6C.
Figure 6E:
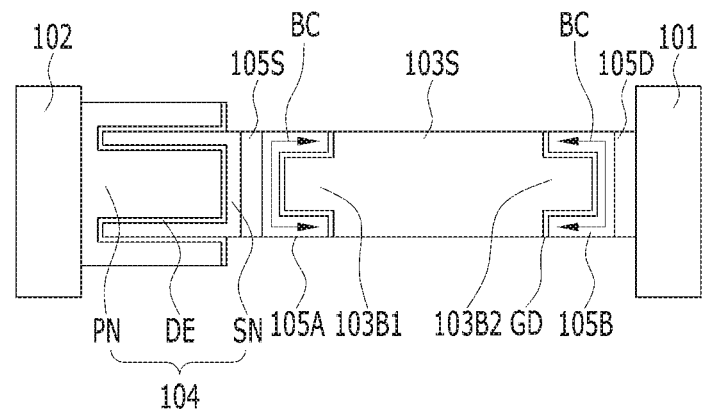
FIG. 6E is a cross-sectional view taken along a line C-C' shown in FIG. 6C.
Figure 6F:
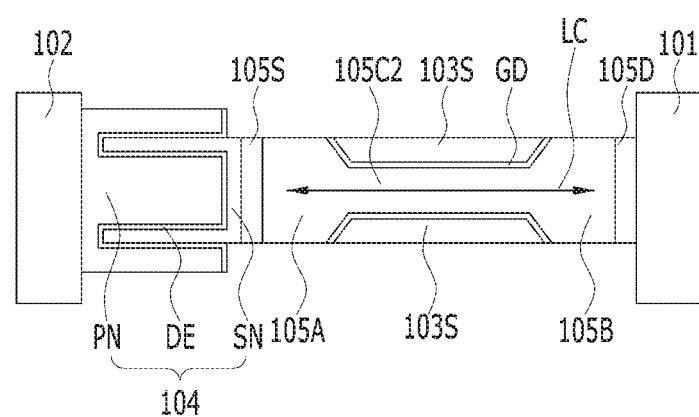
FIG. 6F is a cross-sectional view taken along a line D-D' shown in FIG. 6C.
Figure 6G:
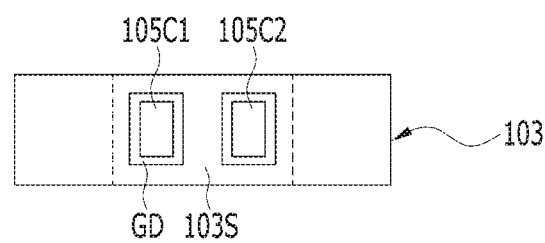
FIG. 6G is a cross-sectional view taken along a line E-E' shown in FIG. 6C.

FIG. 6A is a perspective diagram schematically illustrating an individual memory cell MC shown in FIG. 5. FIG. 6B is a perspective diagram illustrating the individual memory cell MC shown in FIG. 6A in detail. FIG. 6C is a cross-sectional view taken along a line A-A' shown in FIG. 6B. FIG. 6D is a cross-sectional view taken along a line B-B' shown in FIG. 6C. FIG. 6E is a cross-sectional view taken along a line C-C' shown in FIG. 6C. FIG. 6F is a cross-sectional view taken along a line D-D' shown in FIG. 6C. FIG. 6G is a cross-sectional view taken along a line E-E' shown in FIG. 6C.

Referring to FIGS. 6A to 6G, an individual memory cell MC may include a bit line 101, a plate line 102, a transistor TR including a word line 103, and a capacitor 104. The transistor TR may further include an active region 105, and the word line 103 may be a gate all-around structure surrounding a portion of the active region 105. The active region 105 and the word line 103 may correspond to the active region ACT and the gate electrode GAA that are described in the above-described embodiments. A gate dielectric layer GD may be formed between the word line 103 and the active region 105. The gate dielectric layer GD may have a shape surrounding the active region 105.

The bit line 101 may extend vertically in the first direction D1. The plate line 102 may extend vertically in the first direction D1. The capacitor 104 may extend laterally between the bit line 101 and the plate line 102 in the second direction D2. The active region 105 may extend laterally between the bit line 101 and the capacitor 104 in the second direction D2. The word line 103 may extend in the third direction D3.

The transistor TR may be positioned between the bit line 101 and the plate line 102. The capacitor 104, the transistor TR, and the word line 103 may be positioned in a lateral arrangement LA in the second direction D2.

The bit line 101 may include a silicon-base material, a metal-base material, or a combination thereof. The bit line 101 may include polysilicon, titanium nitride, tungsten, or a combination thereof. For example, the bit line 101 may include polysilicon doped with an N-type impurity or titanium nitride (TiN). The bit line BL may include a stack of titanium nitride and tungsten (TiN/W). The bit line 101 may further include an ohmic contact layer, such as metal silicide.

The plate line 102 may include a silicon-base material, a metal-base material, or a combination thereof. The plate line 102 may include polysilicon, titanium nitride, tungsten, or a combination thereof. For example, the plate line 102 may include titanium nitride (TIN). The plate line 102 may include a stack of titanium nitride and tungsten (TiN/W).

The active region 105 may include a first active cylinder 105A, a second active cylinder 105B, and at least one channel portion 105C1 and 105C2. A source region 105S may be formed on one-side edge of the active region 105, and a drain region 105D may be formed on another-side edge of the active region 105. The drain region 105D may be coupled to the bit line 101, and the source region 105S may be coupled to the storage node SN of the capacitor 104. The source region 105S and the drain region 105D may be doped with an N-type impurity. The source region 105S and the drain region 105D may have a vertical structure. The active region 105 and the source/drain regions 105S and 105D may be integrated. In other words, the source region 105S may be formed on one-side edge of the active region 105 by impurity doping, and the drain region 105D may be formed by impurity doping on another-side edge of the active region 105. As for the detailed description of the active region 105, the active region ACT of FIGS. 1 to 413 will be referred to. The source region 105S and the drain region 105D may have a vertical structure.

The word line 103 may include a surrounding portion 103S surrounding the channel portions 10501 and 105C2, and first buried portions 103B1 and 103B2 that respectively extend from both sides of the surrounding portion 103S. The surrounding portion 103S may have a shape surrounding the channel portions 105C1 and 105C2. A gate dielectric layer GD may be formed between the surrounding portion 103S and the channel portions 105C1 and 105C2, and the gate dielectric layer GD may have a shape surrounding the channel portions 105C1 and 105C2. The first buried portion 103B1 of the word line 103 may be buried in the first active cylinder 105A of the active region 105. The second buried portion 103B2 of the word line 103 may be buried in the second active cylinder 105B of the active region 105. A gate dielectric layer GD may be formed between the first buried portion 103B1 and the first active cylinder 105A, and the gate dielectric layer GD may conformally cover the cylindrical inside of the first active cylinder 105A. A gate dielectric layer GD may be formed between the second buried portion 103B2 and the second active cylinder 105B, and the gate dielectric layer GD may conformally cover the cylindrical inside of the second active cylinder 105B.

The capacitor 104 may be positioned laterally to the transistor TR. The capacitor 104 may extend laterally in the second direction D2. The capacitor 104 may include a storage node SN, a dielectric layer DE, and a plate node PN. The storage node SN, the dielectric layer DE, and the plate node PN may be laterally arranged in the second direction D2. The storage node SN may have a laterally oriented cylinder shape, and the plate node PN may have a shape surrounding the cylinder of the storage node SN. The dielectric layer DE may have a shape covering the surface of the cylinder of the storage node SN. The plate node PN may be coupled to the plate line 102. According to another embodiment of the present invention, the plate node PN and the plate line 102 may be integrated, and the plate node PN may be a portion of the plate line 102.

The storage node SN may have a 3D structure, and the storage node SN of the 3D structure may have a lateral 3D structure which is parallel to the second direction D2. As an example of the 3D structure, the storage node SN may have a cylinder shape, a pillar shape, or a combination thereof e.g., a cylinder shape in which a pillar shape and a cylinder shape are combined. In the illustrated embodiment, the storage node SN may have a cylinder shape. A dielectric layer DE may be formed between the storage node SN and the plate node PN. The dielectric layer DE may directly contact the plate node PN.

The capacitor 104 may include a metal-insulator-metal (MIM) capacitor. The storage node SN and the plate node PN may include a metal-base material. The dielectric layer DE may include silicon oxide, silicon nitride, a high-k material, or a combination thereof. The high-k material may have a higher dielectric constant than silicon oxide. The silicon oxide ($SiO_2$) may have a dielectric constant of approximately 3.9, and the dielectric layer DE may include a high-k dielectric material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide (Sr-$TiO_3$). According to another embodiment of the present invention, the dielectric layer DE may be formed of a composite layer including two or more layers of the high-k materials mentioned above.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-base layer ($ZrO_2$-base layer). According to another embodiment of the present invention, the dielectric layer DE may be formed of hafnium-base oxide. The dielectric layer DE may have a stack structure including hafnium oxide ($HfO_2$). The stack structure including hafnium oxide ($HfO_2$) may include an HA ($HfO_2/Al_2O_3$) stack or a HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and HAH stack may be referred to as a hafnium oxide-base layer ($HfO_2$-base layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than the high dielectric material. The dielectric layer DE may include silicon oxide ($SiO_2$) as a high-band gap material other than aluminum oxide ($Al_2O_3$). Since the dielectric layer DE contains a high band gap material, leakage current may be suppressed. The high band gap material may be extremely thin. The high band gap material may be thinner than the high-k material. According to another embodiment of the present invention, the dielectric layer DE may have a laminated structure in which the high-k material and the high-band gap material are alternately stacked. For example, ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure described above, aluminum oxide ($Al_2O_3$) may be extremely thin.

According to another embodiment of the present invention, the dielectric layer DE may include a stack structure including zirconium oxide, hafnium oxide, and aluminum oxide, a laminated structure thereof, or a mixed structure thereof.

According to another embodiment of the present invention, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium ($IrO_2$), platinum (Pt), molybdenum (Mo), molybdenum oxide (MoO), titanium nitride/tungsten (TiN/W) stack, tungsten nitride/tungsten (WN/W) stack. The plate node PN may also include a combination of a metal-base material and a silicon-base material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the storage node SN, and titanium nitride (TiN) may practically serve as a plate node of the capacitor 104, and tungsten nitride may be a low-resistance material.

The plate node PN of the capacitor 104 may have a branch shape extending in the second direction D2 parallel to the plate line 102. The plate node PN may be positioned inside the cylinder of the storage node SN, and the plate node PN may be electrically connected to the plate line 102.

Figure 6H:
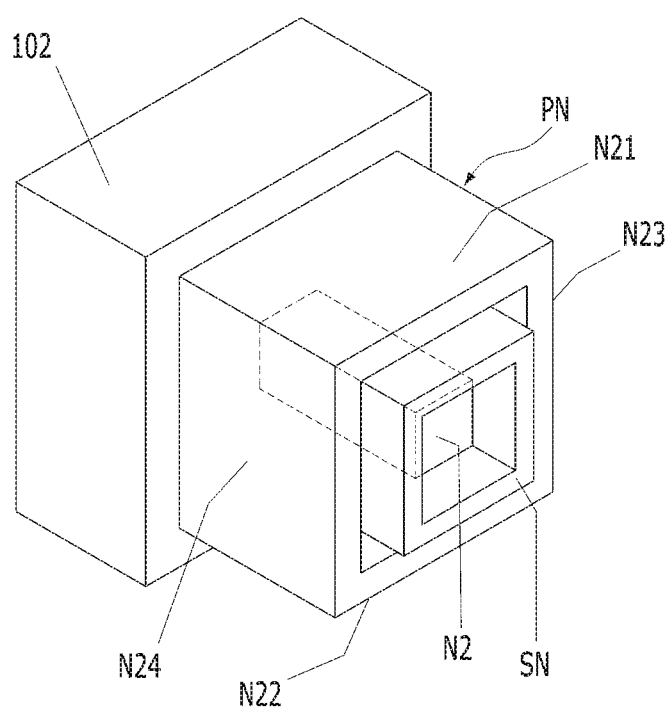
FIG. 6H is a perspective diagram illustrating a capacitor in detail.

FIG. 6H is a detailed view of the capacitor 104, and the plate node PN of the capacitor 104 may include an internal node N2 and external nodes N21, N22, N23 and N24. The internal node N2 and the external nodes N21, N22, N23 and N24 may be interconnected. The internal node N2 may be positioned inside the cylinder of the storage node SN. The external nodes N21, N22, N23 and N24 may be positioned outside the storage node SN with the dielectric layer DE interposed therebetween. The internal node N2 may be positioned inside the cylinder of the storage node SN with the dielectric layer DE interposed therebetween. The external nodes N21, N22, N23 and N24 may be positioned to surround the outer wall of the cylinder of the storage node SN. The external nodes N21, N22, N23 and N24 may be in continuum.

Figure 7A:
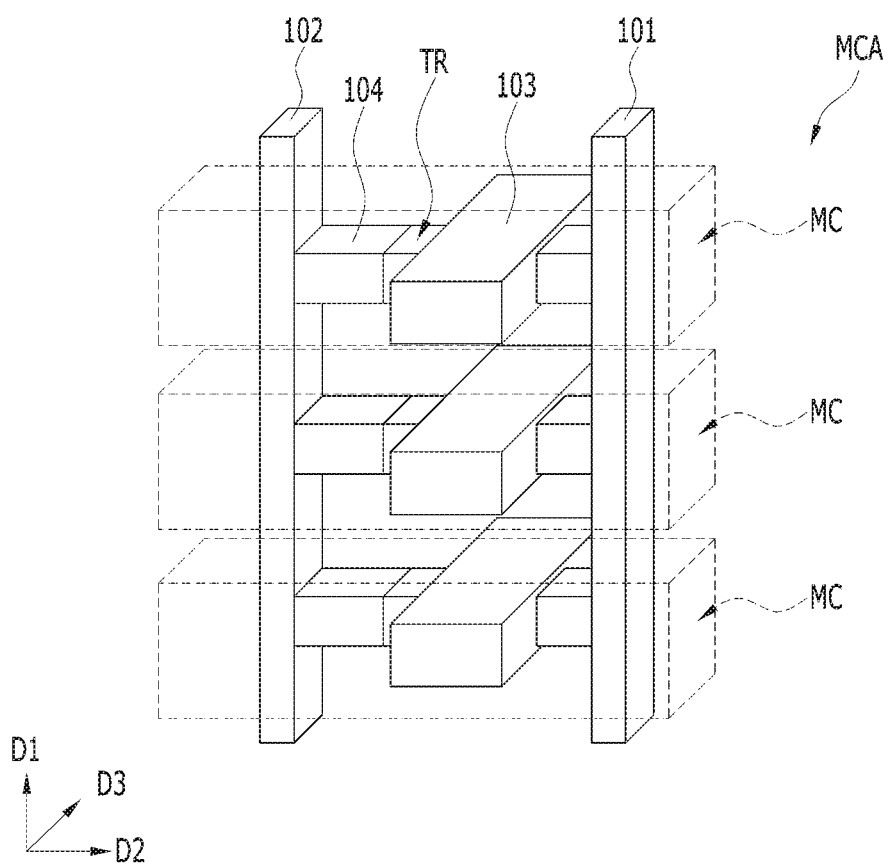
FIGS. 7A and 7B illustrate a memory cell array MCA in accordance with an embodiment of the present invention.
Figure 7B:
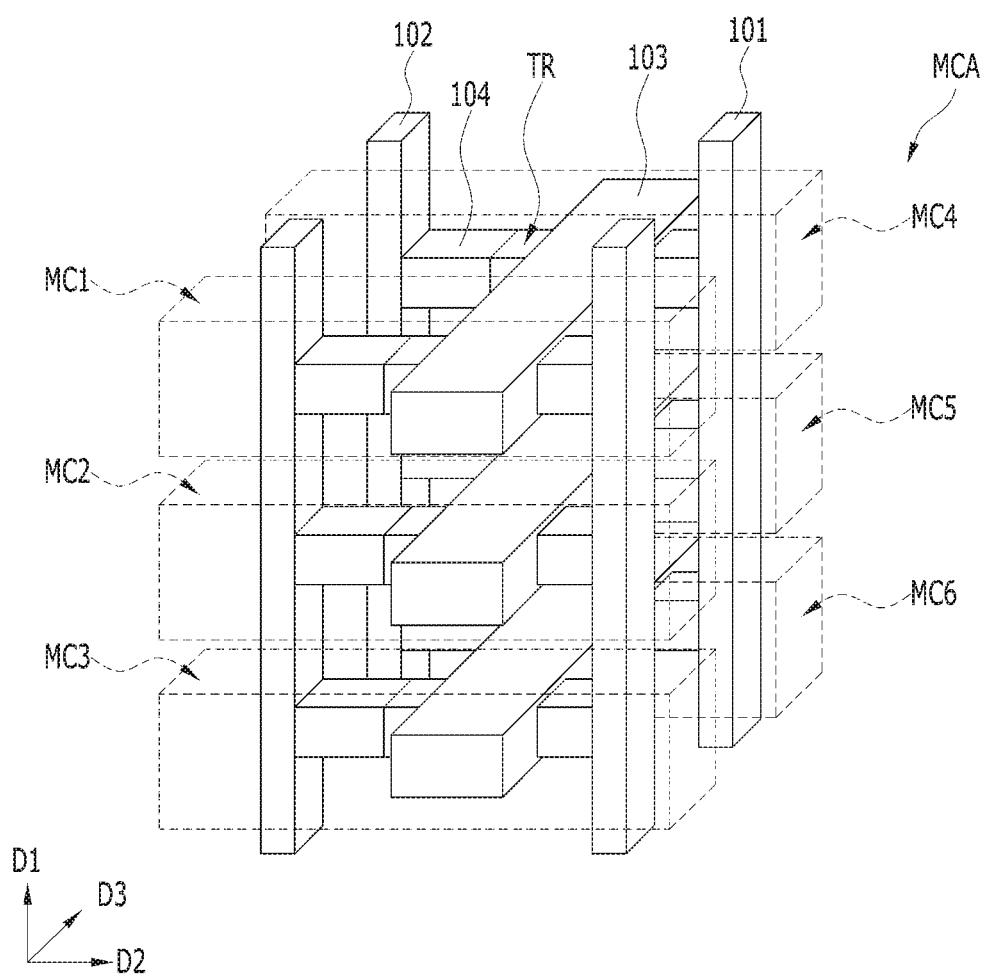

FIGS. 7A and 7B illustrate a memory cell array MCA in accordance with an embodiment of the present invention.

Referring to FIG. 7A, the memory cell array MCA may include a plurality of memory cells MC. The memory cells MC may be vertically stacked in the first direction D1. Each memory cell MC may include a bit line 101, a transistor TR, a capacitor 104, and a plate line 102. In the individual memory cell MC, the bit line 101, the transistor TR, the capacitor 104, and the plate line 102 may be positioned in a lateral arrangement in the second direction D2. The bit line 101 and the plate line 102 may be vertically oriented in the first direction D1. The individual memory cell MC may further include a word line 103 extending in the third direction D3. The transistor TR may be positioned laterally between the bit line 101 and the capacitor 104.

The individual memory cell MC may be the same as the memory cell MC of FIG. 6A.

The memory cells MC stacked in the first direction D1 may share the bit line 101. The memory cells MC stacked in the first direction D1 may share the plate line 102.

Referring to FIG. 7B, the memory cell array MCA may include a plurality of memory cells MC1 to MC6. The memory cells MC1 to MC3 may be vertically stacked in the first direction D1. The memory cells MC4 to MC6 may be vertically stacked in the first direction D1. The memory cells MC1 and MC4 may be arranged laterally in the third direction D3 at a first level, and share a first word line 103. The memory cells MC2 and MC5 may be arranged laterally in the third direction D3, at a second level and share a second word line 103. The memory cells MC3 and MC6 may be arranged laterally in the third direction D3 at a third level and share a third word line 103. Each of the memory cells MC1 to MC6 may include a bit line 101, a transistor TR, a capacitor 104, and a plate line 102. In the individual memory cells MC1 to MC6, the bit line 101, the transistor TR, the capacitor 104, and the plate line 102 may be positioned in a lateral arrangement in the second direction D2. The bit line 101 and the plate line 102 may be vertically oriented in the first direction D1. Each of the memory cells MC1 to MC6 may further include a word line 103, and the word line 103 may extend in the third direction D3. The transistor TR may be laterally positioned between the bit line 101 and the capacitor 104.

The individual memory cells MC1 to MC6 may be the same as the memory cell MC shown in FIG. 6A.

The memory cells MC1 to MC3 and the memory cells MC4 to MC6 stacked in the first direction D1 may share one bit line 101. The memory cells MC1 to MC3 and the memory cells MC4 to MC6 stacked in the first direction D1 may share one plate line 102.

Figure 8:
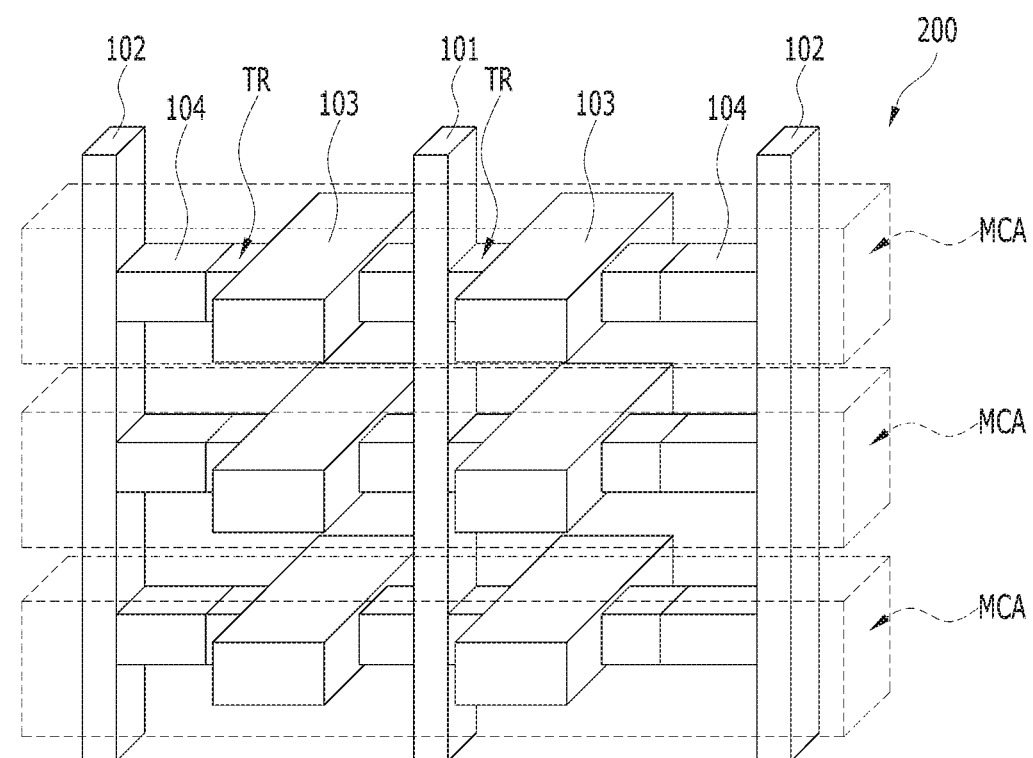
FIG. 8 illustrates a mirror-type memory cell array sharing a bit line.
Figure 9:
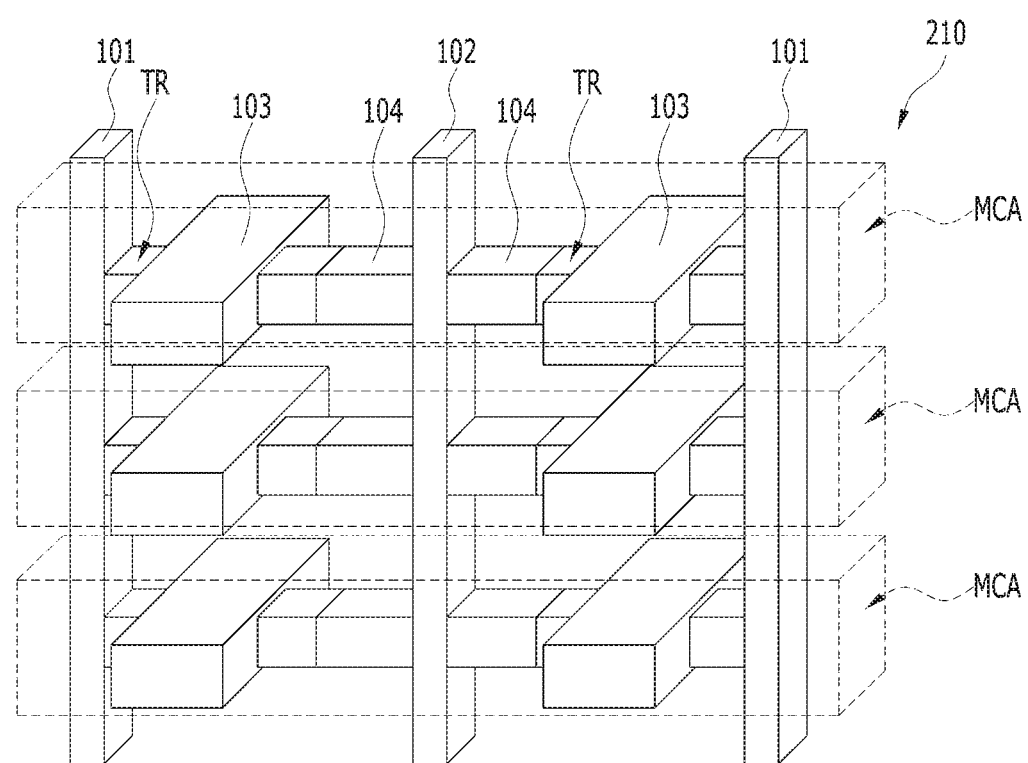
FIG. 9 is a perspective diagram illustrating a mirror-type memory cell array sharing a plate line.

FIG. 8 illustrates a mirror-type memory cell array 200 sharing a bit line 101. FIG. 9 is a perspective diagram illustrating a mirror-type memory cell array 210 sharing a plate line 102.

Referring to FIG. 8, the mirror-type memory cell array 200 sharing the bit line 101 will be described.

In the embodiment of FIG. 8, the memory cell array MCA laterally arranged in the second direction D2 may be arranged in a mirror-type structure sharing one bit line 101 while being coupled to different plate lines 102.

Referring to FIG. 9, a mirror-type memory cell array 210 sharing the plate line 102 will be described.

As illustrated in FIG. 9, The memory cell array MCA arranged in the second direction D2 may be arranged in a mirror-type structure sharing one plate line 102 while being coupled to different bit lines 101.

According to another embodiment of the present invention, the memory device may include both of the mirror-type memory cell array 200 sharing the bit line 101 and the mirror-type memory cell array 210 sharing the plate line 102.

Figure 10A:
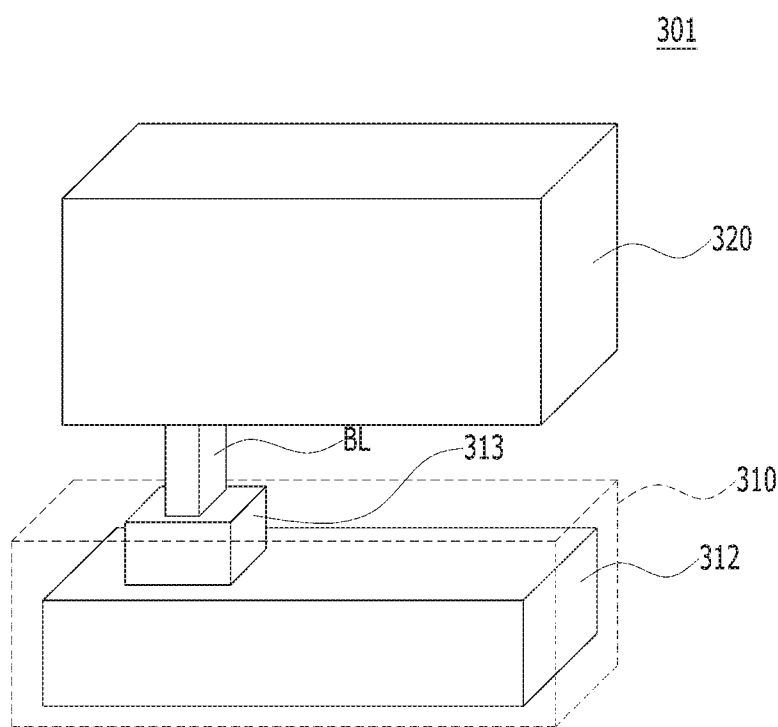
FIGS. 10A and 10B are perspective diagrams illustrating memory devices in accordance with other embodiments of the present invention.
Figure 10B:
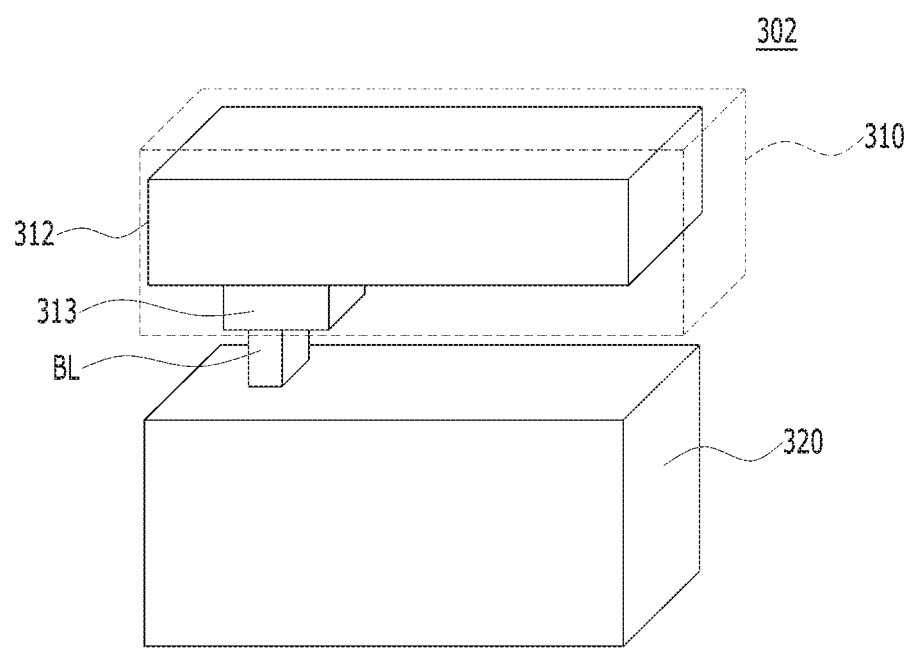

FIGS. 10A and 10B are perspective diagrams illustrating memory devices in accordance with other embodiments of the present invention.

FIGS. 10A and 10B, memory devices 301 and 302 may include a peripheral circuit unit 310 and a memory cell array 320. The memory cell array 320 may include at least one among the memory cell arrays MCA, 200 and 210 shown in FIGS. 7A to 9B. The memory cell array 320 may include a DRAM memory cell array.

Referring to FIG. 10A, the memory cell array 320 may be positioned above the peripheral circuit unit 310. Therefore, the memory device 301 may have a PUC (Peripheral circuit unit-Under-Cell) structure.

Referring to FIG. 10B, the memory cell array 320 may be positioned below the peripheral circuit unit 310. Accordingly, the memory device 302 may have a CUP (Cell-Under-Peripheral circuit unit) structure.

The peripheral circuit unit 310 may refer to a circuit for driving the memory cell array 320 during a read/write operation. The peripheral circuit unit 310 may include an N-channel transistor, a P-channel transistor, a CMOS circuit, or a combination thereof. The peripheral circuit unit 310 may include an address decoder circuit, a read circuit, a write circuit, and the like. The peripheral circuit unit 310 may have a structure including a semiconductor substrate 312 and a sense amplifier 313 that is arranged over the semiconductor substrate 312. The sense amplifier 313 may include transistors having the semiconductor substrate 312 as a channel, and the transistors may be planar channel transistors whose channels are parallel to the surface of the semiconductor substrate 312. Other than the planar channel transistor, the transistor structure in the sense amplifier 313 may include a recess channel transistor, a buried gate transistor, or a fin channel transistor (FinFET).

The bit lines BL of the memory cell array 320 may be electrically connected to the transistors of the sense amplifier 313. Although not illustrated, the bit lines BL and the transistors of the sense amplifier 313 may be interconnected through a multi-layer level metal wire (MLM). The multi-layer level metal wire (MLM) may be formed by a damascene process.

Although not illustrated, according to yet another embodiment of the present invention, the memory devices 301 and 302 may include a first semiconductor substrate and a second semiconductor substrate bonded to the first semiconductor substrate. The memory cell array 320 may be formed over the first semiconductor substrate, and the peripheral circuit unit 310 may be formed over the second semiconductor substrate. Each of the first semiconductor substrate and the second semiconductor substrate may include conductive bonding pads, and the first semiconductor substrate and the second semiconductor substrate may be bonded to each other through the conductive bonding pads. Accordingly, the memory cell array 320 and the peripheral circuit unit 310 may be electrically connected.

Figure 11A:
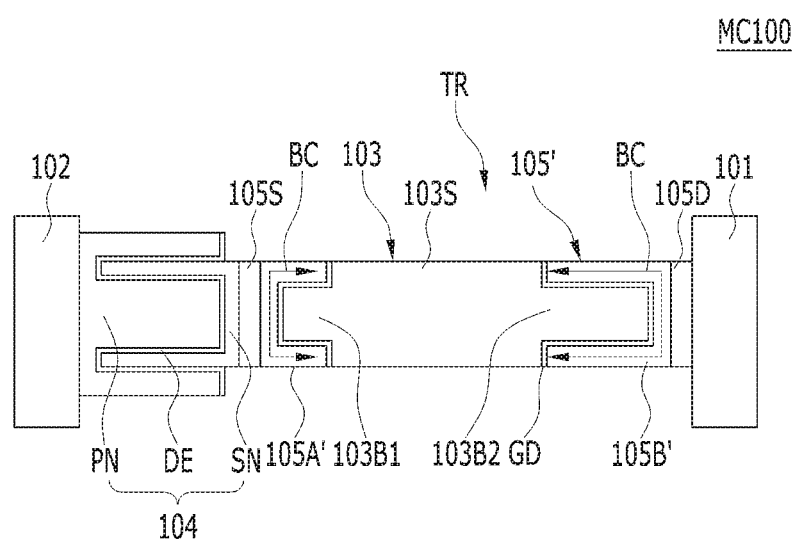
FIGS. 11A and 11B illustrate an individual memory cell in accordance with another embodiment of the present invention.
Figure 11B:
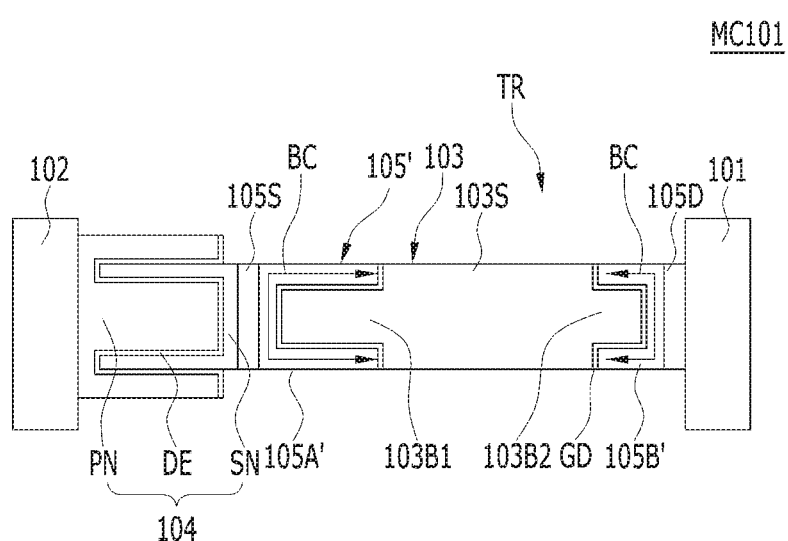

FIGS. 11A and 11B illustrate an individual memory cell in accordance with another embodiment of the present invention. The individual memory cell of FIGS. 11A and 11B may be similar to FIGS. 6A to 6H.

Referring to FIGS. 11A and 11B, the individual memory cells MC100 and MC101 may include a bit line 101, a plate line 102, a transistor TR including a word line 103, and a capacitor 104. The transistor TR may further include an active region 105', and the word line 103 may have a gate all-around structure that surrounds a portion of the active region 105'. A gate dielectric layer GD may be formed between the word line 103 and the active region 105'.

The active region 105' may include a first active cylinder 105A' and a second active cylinder 10513'. Although not shown, the active region 105' may further include a plurality of channel portion, the channel portions may include at least one of the channel portions CH1, CH2, CH11, CH21 of FIGS. 2A to 3B. The first active cylinder 105A' may be coupled to the first doped region 105S, and the second active cylinder 105B' may be coupled to the second doped region 105D.

The first active cylinder 105A' and the second active cylinder 10513' may be asymmetric with each other. Referring to FIG. 11A, the lateral length of the first active cylinder 105A' may be less than the lateral length of the second active cylinder 105B'. Referring to FIG. 1113, the lateral length of the first active cylinder 105A' may be greater than the lateral length of the second active cylinder 105B'.

As described above, the active region 105' including the first active cylinder 105A' and the second active cylinder 105B' that are asymmetrical may be applied to the active region ACT shown in FIGS. 1 to 413.

Figure 12A:
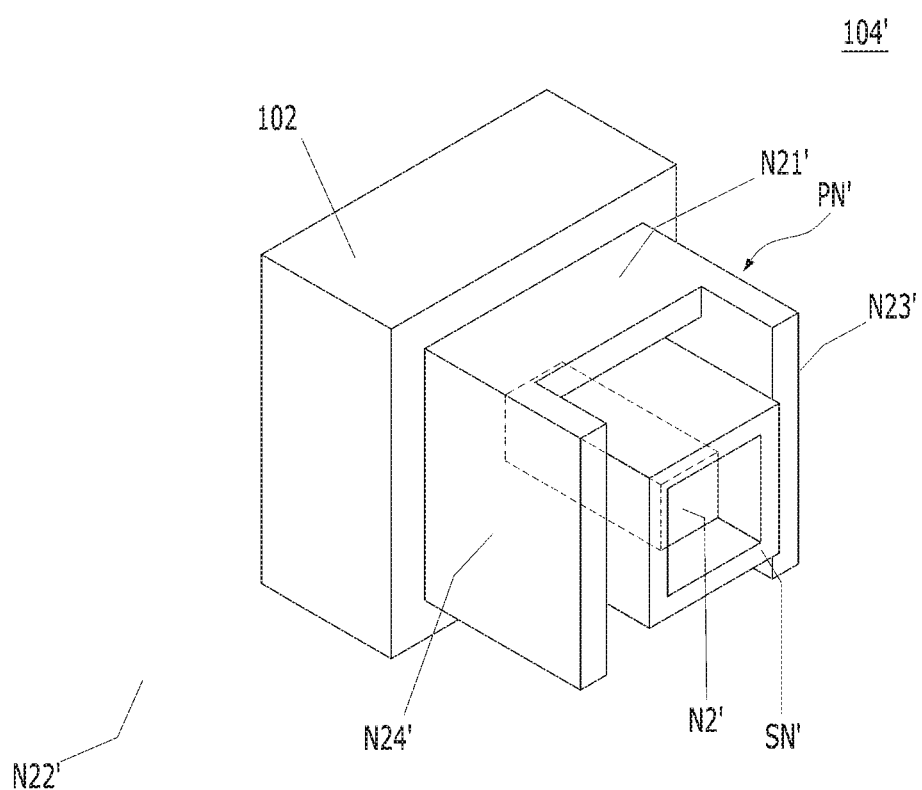
FIG. 12A is a perspective diagram illustrating a capacitor in accordance with another embodiment of the present invention.

FIG. 12A is a perspective diagram illustrating a capacitor in accordance with another embodiment of the present invention. The capacitor of FIG. 12A may be similar to those of FIGS. 6A to 6H.

Referring to FIG. 12A, the capacitor 104' may include a storage node SN' and a plate node PN'. The plate node PN' may be coupled to the plate line 102.

Figure 12B:
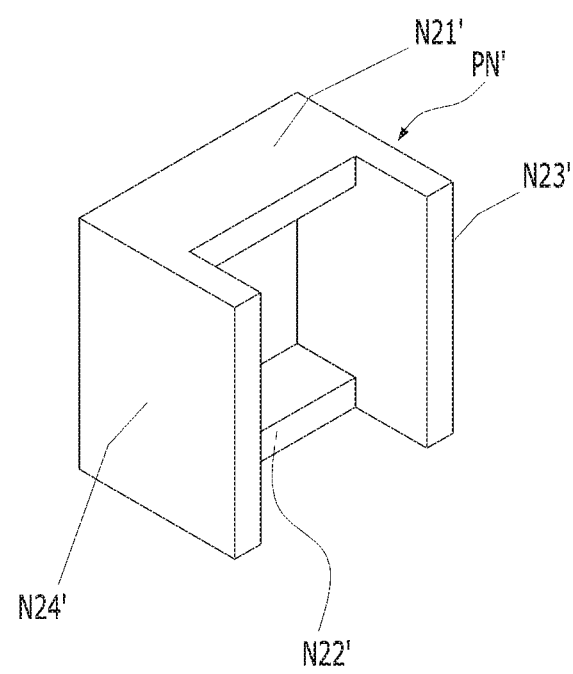
FIG. 12B is a detailed view of a plate node of the capacitor of FIG. 12A.

FIG. 12B is a detailed view of the plate node PN' of the capacitor 104'. The plate node PN' may include an internal node N2' and external nodes N21', N22', N23' and N24'.

The external nodes N21", N22', N23' and N24' may include a first external node N21', a second external node N22', a third external node N23' and a fourth external node N24'. The first external node N21' and the second external node N22' may be positioned in the upper side and the lower side of a storage node SN', and the third external node N23' and the fourth external node N24' may be positioned on the sides of the storage node SN'. The third external node N23' and the fourth external node N24' may be positioned on the sides of the storage node SN'.

The lateral lengths of the first external node N21" and the second external node N22' may be the same. The lateral lengths of the third external node N23' and the fourth external node N24' may be the same. The lateral lengths of the first external node N21' and the second external node N22' may be less than the lateral lengths of the third external node N23' and the fourth external node N24'.

Since the lateral lengths of the third external node N23' and the fourth external node N24' are large, the storage node SN' may be supported more stably.

According to the embodiments of the present invention described above, it is possible to perform overlap control of a source region/a drain region in a 3D DRAM. Since it is not affected by the variation of the etching profile according to the dimension of the transistor, for example, the channel size and the dimension of the word line, it is possible to realize a 3D DRAM with excellent mass productivity.

According to the embodiments of the present invention, the 3D memory device includes transistors and capacitors that are stacked over a substrate in three dimensions. As a result, the integration density of the memory device may be improved.

While the present invention has been described with respect to specific embodiments, it will be apparent to those skilled in the art that various changes and modifications may be made without departing from the spirit and scope of the invention as defined in the following claims.

What is claimed is:

1. A memory cell, comprising:
   a bit line and a plate line spaced apart from each other and vertically oriented in a first direction;
   a transistor comprising an active region laterally oriented in a second direction perpendicular to the first direction, wherein the active region including a first active cylinder, a second active cylinder, and a first and second channel portions oriented laterally between the first active cylinder and the second active cylinder;
   a gap disposed between the first channel portion and the second channel portion;
   a word line extending in a third direction while surrounding the first and second channel portions of the active region and filling the gap; and
   a capacitor oriented laterally in the second direction between the active region and the plate line.

2. The memory cell of claim 1, wherein the first active cylinder, the second active cylinder and the first and second channel portions are positioned in a lateral arrangement in the second direction.

3. The memory cell of claim 1, wherein the word line includes:
   a surrounding gate electrode surrounding the first and second channel portions; and
   a first buried gate electrode extending from one side of the surrounding gate electrode and buried in the first active cylinder; and
   a second buried gate electrode extending from another side of the surrounding gate electrode and buried in the second active cylinder.

4. The memory cell of claim 3, wherein the active region includes buried channels that are defined by the first buried gate electrode and the second buried gate electrode.

5. The memory cell of claim 1, further comprising:
   a vertical source region between the capacitor and the first active cylinder; and
   a vertical drain region between the second active cylinder and the bit line.

6. The memory cell of claim 1, further comprising:
   a gate dielectric layer formed between the word line and the active region.

7. The memory cell of claim 1, wherein the capacitor includes:
   a cylinder-shape storage node coupled to the first active cylinder of the active region;
   a plate node coupled to the plate line; and
   a dielectric material between the storage node and the plate node,
   wherein the storage node, the dielectric material, and the plate node are positioned in a lateral arrangement in the second direction.

8. The memory cell of claim 7, wherein the plate node includes:
   an internal node that is laterally oriented from the plate line and extends into the storage node; and
   a plurality of external nodes that are laterally oriented from the plate line and surround the storage node.

9. The memory cell of claim 8, wherein the external node includes:
   first and second external nodes positioned over the storage node in the first direction; and
   third and fourth external nodes positioned over the storage node in the third direction,
   wherein the lateral lengths of the first external node and the second external node are shorter than the lateral lengths of the third external node and the fourth external node.

10. The memory cell of claim 9,
    wherein a lateral length of the first external node and a lateral length of the second external node are the same, and
    a lateral length of the third external node and a lateral length of the fourth external node are the same.

11. The memory cell of claim 1, wherein the first active cylinder and the second active cylinder are positioned at the same level and have cylinder-shapes that are laterally oriented to be opposite to each other in the second direction.

12. The memory cell of claim 1, wherein the lateral length of the first active cylinder in the second direction is different from the lateral length of the second active cylinder in the second direction.

13. The memory cell of claim 1, wherein the at least one channel portion includes
    edges contacting the first active cylinder and the second active cylinder, and
    a channel body between the edges,
    wherein contact surfaces between the channel body and the edges are smaller than contact surfaces between the first and second active cylinders, and the edges.

14. The memory cell of claim 13, wherein the at least one channel portion has a thickness that gradually decreases from the edges toward the channel body.

15. The memory cell of claim 1,
wherein the first active cylinder includes a laterally oriented first recessed portion, and
the second active cylinder includes a laterally oriented second recessed portion, and
wherein the laterally oriented first recessed portion and the laterally oriented second recessed portion are opposite to each other in the second direction.

16. The memory cell of claim 15, wherein the first active cylinder is positioned between the capacitor and the laterally oriented first recessed portion, and includes a first vertical side wall that is coupled to the capacitor.

17. The memory cell of claim 15, wherein the second active cylinder is positioned between the bit line and the laterally oriented second recessed portion, and includes a second vertical side wall that is coupled to the bit line.

18. The memory cell of claim 1, wherein the active region, the first active cylinder and the second active cylinder include a semiconductor material.

19. The memory cell of claim 1,
wherein the gap, the first channel portion and the second channel portion are positioned at the same level along the third direction.

\* \* \* \* \*